United States Patent [19]
Loferski et al.

[11] 4,166,880
[45] Sep. 4, 1979

[54] SOLAR ENERGY DEVICE

[75] Inventors: Joseph J. Loferski, Providence; Barton Roessler, Barrington, both of R.I.

[73] Assignee: Solamat Incorporated, Barrington, R.I.

[21] Appl. No.: 870,369

[22] Filed: Jan. 18, 1978

[51] Int. Cl.² .................. F24J 3/02; H01L 27/14; H01L 31/00
[52] U.S. Cl. .................. 428/457; 136/89 SG; 148/174; 156/613; 156/614; 357/30; 427/34; 427/86; 428/913; 429/120
[58] Field of Search .............. 126/270, 271; 148/174, 148/175; 136/89 SG; 156/613, 614; 357/30; 428/457, 913; 427/34, 86; 429/120

[56] References Cited
U.S. PATENT DOCUMENTS

| 2,917,817 | 12/1959 | Tabor et al. | 29/180 |
| 3,953,876 | 4/1976 | Sirtl et al. | 357/30 X |
| 3,969,163 | 7/1976 | Wakefield | 148/175 X |
| 3,990,914 | 11/1976 | Weinstein et al. | 126/270 X |
| 4,003,770 | 1/1977 | Janowiecki | 148/174 |
| 4,105,822 | 8/1978 | Jong | 126/270 X |
| 4,121,238 | 10/1978 | Bachmann et al. | 357/30 X |

OTHER PUBLICATIONS

Applied Physics Letters, vol. 29, No. 10, pp. 682–684, ITO/Si Heterojunction Solar Cells, Mizrah et al., 11/76.

Primary Examiner—Harold Ansher

[57] ABSTRACT

Selective absorber including a layer of semiconductor applied by arc plasma spraying over a metallic surface.

2 Claims, 2 Drawing Figures

SOLAR ENERGY DEVICE

FIELD OF THE INVENTION

This invention relates to devices for capturing solar energy, and more particularly to such devices in which portions with selective absorption receive the sun's rays.

BACKGROUND OF THE INVENTION

It is well known that the present energy crisis makes desirable achieving practical and efficient techniques for turning solar energy to practical use.

It is recognized in the prior art that solar energy collection panels may desirably incorporate selective absorbers. These selective absorbers have absorptance and emittance which are very different for different wave lengths—high for the sun's shorter wave lengths and low for infrared's longer wave lengths. A curve for one such absorber is shown in FIG. 1. (Reflectance is one minus emittance. Absorptance and emittance are in general the same for any body at a given wave length; in black bodies they are the same at all wave lengths.)

A. B. Meinel and M. P. Meinel, "Applied Solar Energy: An Introduction" (Addison-Wesley, Reading, Mass., 1976), Chapter 9, have described how to obtain a selective absorber by using two layers of material, one to absorb the sunlight and the other to reflect infrared. So too has B. O. Seraphin, "Chemical Vapor Deposition Research for Fabrication of Solar Energy Converter," Tech. Report for NSF-RANN Grant SE/GE-36731, NSF-RA-N-74-128, NTIS Order No. PB-238-947 and NSF-RA-N-75-018, NTIS Order No. PB-241-006; Seraphin taught a layer of sunlight-absorbent silicon deposited by chemical vapor deposition on a reflecting metal surface, and also that a multilayer structure in which successive layers are pure silicon and pure germanium gives nearly ideal selectivity.

Janowiecki et al. U.S. Pat. No. 4,003,770 taught the use of arc plasma spraying to place a layer of silicon on a steel or copper substrate.

It was taught in the prior art (e.g., Goldner and Haskal, "Indium-Tin-Oxide Coated Silicon As a Selective Absorber," Applied Optics, 10, p. 2329 (October, 1975) that a transparent and conductive indium-tin oxide ("ITO") coating reduced infrared radiation from doped and undoped silicon layers. Burk et al., "Fabrication of OSOS Cells by Neutral Ion Beam Sputtering" Proc. of 12th IEEE Photovaltaic Specialists Conference, Baton Rouge, Louisiana (November, 1976), p. 971) taught that when deposited on p-type silicon ITO forms an electrical charge separating barrier which like a suitable pn junction produces an electrical output from a light energy input (i.e., provides a photovaltaic cell).

Green et al. ("Minority Carrier MIS Tunnel Diodes and their Application to Electron and Photo-Voltaic Energy Conversion, Part I: Theory," Solid State Electronics, 17, No. 6, p. 551, June (1974) and Shewchun et al. ("Minority Carrier MIS Tunnel Diodes and their Application to Electron and Photo-Voltaic Energy Conversion, Part II: Experiment," Solid State Electronics, 17, No. 6, p. 563, June (1974)) taught that, when an insulating film thin enough to permit tunnelling of charge carriers is interposed between a semiconductor and a transparent metal coating, useful photovoltaic devices result.

Deposit of semiconductor on aluminum panels by arc plasma spraying to form a pn junction is taught in pending U.S. patent application Ser. No. 724,963, of Henryk Rzewuski, Jurek S. Piekoszewski, and Joseph J. Loferski, "PN Junction Device and Method of Making" now abandoned in favor of pending streamlined continuation Ser. No. 870,562, filed Jan.18, 1978, with which the inventors hereof were familiar before making the invention of the selective absorber panels herein disclosed.

SUMMARY OF THE INVENTION

We have discovered that by using arc plasma spraying to produce a semiconductor layer in a selectively absorbing panel including a reflective metal substrate, a very practical, inexpensive device results. In certain embodiments of the invention, the devices are hybrid photovoltaic devices (i.e., they produce outputs of both heat and electricity) and an ITO layer is deposited by arc plasma spraying. Large-area panels, with good adhesion, uniformity, predetermined thickness, good durability, and good selective absorption inexpensively advantageously result.

PREFERRED EMBODIMENT OF THE INVENTION

We turn now to the presently preferred embodiments of the invention.

DESCRIPTION OF THE MOST PREFERRED EMBODIMENT

Figure 1:
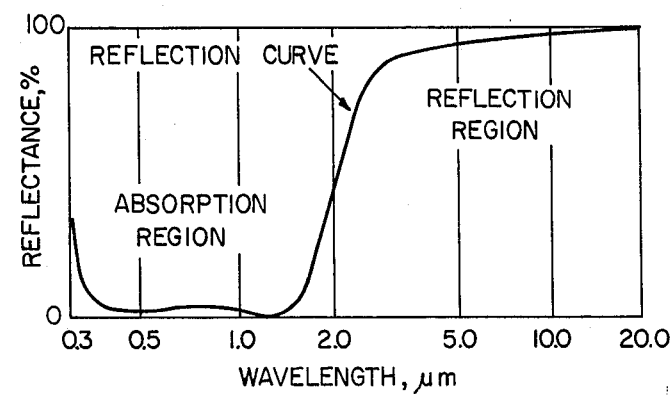
FIG. 1 is a curve of a prior art selective absorber.
Figure 2:
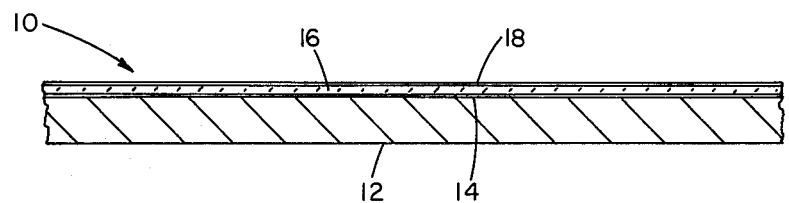
FIG. 2 is a diagrammatic view, with layers shown disproportionately in size for clarity, of the presently preferred embodiment of our invention.

There is shown in FIG. 2 a section through a portion of a panel, indicated generally at 10. The panel has a thin, supporting, base layer 12 of aluminum, with an area of 32 square feet. Over the aluminum layer 12 is a diffusion barrier layer 14 of arc plasma sprayed chromium oxide ($Cr_2O_3$) 5 microns in thickness. Over the chromium oxide layer is a layer 16, 30 microns in thickness, of highly pure silicon with a resistivity of 100 ohm centimeters, laid down by arc plasma spraying of pure silicon powder. The spraying gives to the aluminum a roughness which provides selective absorption (Mie effect) and diffuse (instead of specular) reflection at wavelengths shorter than the dimensions (several microns) of the surface roughness; both effects provide additional selectivity and increased energy production. Over the silicon is a layer 0.8 microns thick, of indium-tin oxide, about 2.2 atomic percent tin, and laid down in the manner taught by R. Groth in "Untersuchungen an halbleitenden Indiumoxydschichten," Phys. Stat. Sol. 11, 69 (1966), the layer 18.

The panel may be assembled and used in solar collectors of the sort known in the art, as disclosed in Meinel et al., supra.

SECOND EMBODIMENT

In a second embodiment, everything is as in the presently preferred embodiment just described, except that the semiconductor layer deposited by arc plasma spraying is an alloy 5:95 by weight of silicon:germanium, respectively, and is laid down by arc plasma spraying of alloy powders of this composition.

THIRD EMBODIMENT

In a third embodiment, everything is as in the presently preferred embodiment, except that the silicon layer has a light n- doping and a resistivity of 10 ohm centimeters, the $Cr_2O_3$ layer is omitted, and the indium-tin oxide layer is deposited by arc plasma spraying. A low resistance nickel contact grid is deposited over the indium-tin oxide layer by arc plasma spraying through a grid mask.

FOURTH EMBODIMENT

In a fourth embodiment a 100 micron thick layer of silicon p- doped to a resistivity of 0.2 ohm-cm is deposited on an aluminum sheet by arc plasma spraying. The silicon is etched with hydrofluoric acid to clean the silicon, and a native oxide, $SiO_x$, is then formed by exposing the surface to air for a time sufficient to form a layer of oxide 20 Angstroms in thickness. A layer of indium-tin oxide 2000 Angstroms thick containing 20 weight percent indium oxide is then deposited over the native oxide by argon atom sputtering in the manner taught by Burk et al., supra. This embodiment has the advantage that, since Al is a p- dopant for silicon, a back surface $p^+p$ junction is formed, which is highly reflective of minority electrons. A low resistance aluminum contact grid is deposited over the indium-tin oxide layer by vacuum evaporation.

FIFTH EMBODIMENT

In a fifth embodiment, everything is as in the fourth embodiment just described, except the layer of indium-tin oxide is replaced by a 60 Angstrom thick layer of aluminum deposited by vacuum evaporation.

OPERATION

When assembled into known solar assemblies, the panels of the preferred embodiment and the second embodiment above described produce useful heat energy, which may suitably be transferred from the back of the aluminum base of the panel to a circulating heat transfer fluid. The third, fourth, and fifth embodiments above described produce both heat energy and electrical energy. The $Cr_2O_3$ layer in each instance in which it is used acts as a diffusion barrier.

In all the embodiments, the surface of the metal base has low emittance and high reflectance for longer wave lengths, the semiconductor has high absorptance for the shorter wave lengths, and the ITO has high reflectance for longer wave lengths and high transmittance for shorter wave lengths.

OTHER EMBODIMENTS

Other metals may be used as the base (e.g., steel, copper, or an alloy) and for the contact grid (e.g., Ag). Absorption edge location can be varied by varying the ratio of semiconductor ingredients either in alloy powders or in mechanical mixtures of powders and by using other semiconductors with appropriate absorption edges (e.g., $Cu_2S$, InAs, InP, $CuInSe_2$, and $Cu_2O$). Other diffusion barrier materials or buffer layers (e.g., Ti and V to form $TiAl_3$ and $VAl_3$) and transparent conducting compounds (e.g., molybdenum trioxide, tin oxide, cadmium stannate, and ruthenium dioxide) may be used. Other embodiments of the invention will occur to those skilled in the art.

What is claimed is:

1. A selective absorber panel for converting solar energy to useful heat energy which comprises a base and a layer of semiconductor overlying said base, said base being of metal and having a surface toward said semiconductor reflective of infrared, and said semiconductor being absorptive to sunlight, said semiconductor being arc plasma sprayed, said panel including a layer of transparent conducting oxide over said layer of semiconductor, said panel also including an insulating film thin enough to permit tunnelling of current carriers interposed between the semiconductor and the transparent conducting oxide layers to produce an efficient photovoltaic cell, in which panel the semiconductor is p-type silicon, the insulating film is a native oxide of silicon, and the transparent conducting oxide is indium-tin oxide.

2. A selective absorber panel for converting solar energy to useful heat energy which comprises a base and a layer of semiconductor overlying said base, said base being of metal and having a surface toward said semiconductor reflective of infrared, and said semiconductor being absorptive to sunlight, said semiconductor being arc plasma sprayed, said panel including a transparent conducting layer of metal over said layer of semiconductor, said panel also including an insulating film thin enough to permit tunnelling of current carriers interposed between the semiconductor and the transparent conducting metal layers to produce an efficient photovoltaic cell, in which panel the semiconductor is p-type silicon, the insulating film is a native oxide of silicon, and the transparent conducting layer of metal is aluminum.

* * * * *